(12) United States Patent
Ham

(10) Patent No.: US 8,105,762 B2
(45) Date of Patent: Jan. 31, 2012

(54) METHOD FOR FORMING PATTERN USING PRINTING PROCESS

(75) Inventor: Yong-Sung Ham, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/736,709

(22) Filed: Dec. 17, 2003

(65) Prior Publication Data

US 2004/0126714 A1 Jul. 1, 2004

(30) Foreign Application Priority Data

Dec. 18, 2002 (KR) .................... 10-2002-0081446

(51) Int. Cl.
*B41F 9/00* (2006.01)

(52) U.S. Cl. ........ 430/322; 430/324; 101/153; 101/150; 101/34

(58) Field of Classification Search .................. None
See application file for complete search history.

(56) References Cited

U.S. PATENT DOCUMENTS

| | | | |
|---|---|---|---|
| 4,294,650 A | 10/1981 | Werthmann | |
| 5,259,926 A | 11/1993 | Kuwabara et al. | |
| 5,514,503 A | 5/1996 | Evans et al. | |
| 5,544,582 A | 8/1996 | Bocko et al. | |
| 5,678,483 A | 10/1997 | Johnson | |
| 5,701,815 A | 12/1997 | Bocko et al. | |
| 5,850,271 A * | 12/1998 | Kim et al. | 349/111 |
| 6,001,515 A | 12/1999 | Evans et al. | |
| 6,356,318 B1 | 3/2002 | Kawahata | |
| 6,722,760 B2 * | 4/2004 | Jeong et al. | 347/46 |
| 6,940,578 B2 * | 9/2005 | Baek et al. | 349/187 |
| 7,140,296 B2 * | 11/2006 | Baek et al. | 101/170 |
| 2002/0073863 A1 * | 6/2002 | Yoshizawa et al. | 101/415.1 |
| 2003/0124865 A1 * | 7/2003 | Baek et al. | 438/694 |

FOREIGN PATENT DOCUMENTS

| | | |
|---|---|---|
| EP | 0 471 628 A1 | 2/1992 |
| JP | 63-205608 A | 8/1988 |
| JP | 3-280416 A | 12/1991 |
| JP | 4-94115 A | 3/1992 |
| JP | 4-239684 A | 8/1992 |
| JP | 4-249189 A | 9/1992 |
| JP | 4-296724 A | 10/1992 |
| JP | 5-11270 A | 1/1993 |
| JP | 6-202314 A | 7/1994 |
| JP | 7-240523 A | 9/1995 |
| JP | 09-318805 | * 12/1997 |

* cited by examiner

*Primary Examiner* — Daborah Chacko Davis

(74) *Attorney, Agent, or Firm* — Birch, Stewart, Kolasch & Birch, LLP

(57) ABSTRACT

A pattern and method for forming a pattern includes providing a substrate on which a plurality of unit panels and etching object layers on the respective unit panel areas are formed, dividing the substrate into at least two or more areas, providing a cliché on which multiple grooves are formed, filling resist in the grooves, applying the resist filled in the groove of the cliché onto the etching object layer of the substrate by the divided area unit.

9 Claims, 5 Drawing Sheets

METHOD FOR FORMING PATTERN USING PRINTING PROCESS

This application claims priority of Korean Application No. 81446/2002, filed Dec. 18, 2002, the entire contents of which are hereby incorporated by reference.

BACKGROUND OF THE INVENTION

1. Field of the Invention

The invention relates to a pattern and to a method for forming a pattern using a printing process, and particularly to a method for forming a pattern which alleviates the problem of an uneven pattern generated as a substrate becomes larger.

2. Description of the Related Art

In display devices, particularly in flat panel display devices, pixels are arranged in a matrix. Flat panel devices, such as LCD devices, have an active device, such as Thin Film Transistors (hereinafter, TFTs) positioned in respective pixels for driving the pixels in the display devices. This method of driving the display device is called the active matrix driving method because the active devices are arranged in the respective pixels aligned in a matrix form.

FIG. 1 shows a plan view of a pixel in a conventional LCD device using the active matrix method. The active device is a TFT 10. Gate lines 2 are arranged lengthwise and data lines 4 are arranged widthwise to define a pixel. The TFT 10 for independently controlling the driving of the respective pixel is formed near where one of the gate lines and one of the data lines cross over each other. The TFT 10 includes a gate electrode 2a, which is connected with one of the gate lines 2, a semiconductor 5 that is formed on the gate electrode 2a, and source and drain electrodes 4a and 4b that are formed on the semiconductor layer 5. The TFT 10 activates when a scan signal is applied to the gate electrode 2a by one of the gate lines 2. In the pixel, a pixel electrode 7, which is connected to the drain electrodes 4b, is supplied with an image signal through the source and drain electrodes 4a and 4b when the semiconductor layer 5 is activated by the gate electrode 2a. The pixel electrode 7 is connected with the drain electrode 4b through the first contact hole 8a. A storage line 6 and a storage electrode 11, which overlaps the storage line 6, are positioned in the pixel defined by the gate line 2 and the data line 4 to form a storage capacitor Cst. The storage electrode 11 is connected with the pixel electrode 7 through a second contact hole 8b.

FIG. 2 is a cross-sectional view taken along section line I-I' of FIG. 1 showing a TFT 10 and storage capacitor Cst positioned inside the pixel. As shown in FIG. 2, the TFT 10 includes a substrate 1 made of transparent insulating material (such as glass), a gate electrode 2a formed on the substrate 1, a gate insulating layer 13 deposited over the entire substrate 1, a semiconductor layer 5 formed over the gate insulating layer 13 and source/drain electrodes 4a and 4b formed over the semiconductor layer 5, a passivation layer 15 formed over the source/drain electrodes 4a and 4b to protect the device, and a pixel electrode 7 connected with the drain electrode 4b through the first contact hole 8a.

The storage capacitor Cst includes a storage line 6 formed during the same series of patterning processes as the gate electrode 2a of the TFT, and a storage electrode 11 formed during the same series of patterning processes as the source and drain electrodes 4a and 4b. A gate insulating layer 13 is formed between the storage line 6 and storage electrode 11. A second contact hole 8b for exposing a part of the storage electrode 11 is formed in the passivation layer 15. The storage electrode 11 is electrically connected with the pixel electrode 7 through the second contact hole 8b. The storage capacitor Cst charges via a gate voltage while a gate signal is applied to the gate electrode 2a, and then holds the charge until the gate electrode 2 is selected in the next frame to prevent voltage change of the pixel electrode 7.

The LCD device described above is fabricated by a photo-mask process, and the photo-mask process includes a series of processes such as photo-resist application, arrangement and exposure, development, cleaning, etc.

FIGS. 3A-3C are views illustrating a method for forming a pattern in the photo-mask process. First, as shown in FIG. 3A, a substrate 30 including an etching object layer is provided. A photo-resist layer 31 of polymer resin is evenly applied on the substrate 30 through a spin coating or a roll coating method. Next, as shown in FIG. 3B, the photo-resist layer 31 is blocked by a mask 33 on which a non-transparent area for the light is selectively formed, and then, UV light (arrows in FIG. 3B) is radiated to expose the photo-resist layer 31 except the blocked area. Next, as shown in FIG. 3C, the photo-resist layer 31 on which the ultraviolet light has radiated is developed to form a photo-resist pattern 31a selectively remaining on the substrate 30. After that, the etching object layer (not shown) formed on the substrate 30 is etched by using the photo-resist pattern 31a as a mask, and therefore, the desired pattern is formed.

However, according to a related photo-mask process, expensive equipment such as a mask and the exposing apparatus is required. Therefore, the production cost increases. Also, aligning the mask and the substrate exactly becomes difficult due to the limitations of the exposing apparatus in the exposure process. Therefore, there is a limit in forming a fine pattern requiring a high degree of accuracy. Moreover, since there is a limited exposure area of the exposing apparatus in the photo processing of the display device, the screen must be divided to fabricate a display device having a larger area. Therefore, the photo process must be repeated many times. The productivity is accordingly lowered, and thus it becomes difficult to meet the demand for larger substrate displays.

SUMMARY OF THE INVENTION

Therefore, an object of the invention is to provide a method for forming a pattern which is able to form a pattern on a display device of larger area in a printing process.

Also, another object of the invention is to provide a method for forming a pattern which is able to form the pattern evenly on entire substrate.

The invention, in part, pertains to a pattern and to a method for forming a pattern that includes providing a substrate on which multiple unit panels and etching object layers on the respective unit panel areas are formed, dividing the substrate into at least two or more areas, providing a cliché on which multiple grooves are formed, filling resist in the grooves, and applying the resist filled in the groove of the cliché onto the etching object layer of the substrate by the divided area unit.

The invention, in part, pertains to a pattern and to a method for forming a pattern that includes providing a substrate on which multiple unit panels and etching object layers on the respective unit panel areas are formed, dividing the substrate into multiple divided areas so as to include at least one or more unit panels, providing a cliché on which multiple grooves are formed, filling resist in the grooves of the cliché, providing a printing roll having same width as that of the divided area of the substrate, transferring the resist filled in the groove of the cliché onto a surface of the printing roll by contacting and rotating the printing roll on the cliché, and of applying the resist transferred on the surface of the printing roll on the etching object layer.

In the invention, applying the resist on the etching object layer can entail providing a printing roll having a same width as that of the divided area of the substrate, transferring the resist in the groove of the cliché onto a surface of the printing roll by contacting and rotating the printing roll on the cliché corresponding to the divided area of the substrate, and applying the resist transferred on the surface of the printing roll on the etching object layer. Also, a blanket can be applied on the surface of the printing roll.

In the invention, a length of the blanket can be the same as a length of a circumference of the printing roll, which is same as a length of the divided area of the substrate. The divided area of the substrate can include one or more unit panels. The cliché can be formed to have a same size as that of the divided area of the substrate. The printing roll can be formed to have a same size as that of the divided area on the substrate. The etching object layer can include a metal layer, or the etching object layer can be an insulating layer made of SiOx or SiNx. Also, the etching object layer can be a semiconductor layer.

The foregoing and other objects, features, aspects and advantages of the invention will become more apparent from the following detailed description of the invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Advantages of the invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

Reference will now be made in detail to the preferred embodiments of the invention, examples of which are illustrated in the accompanying drawings.

Figure 1:
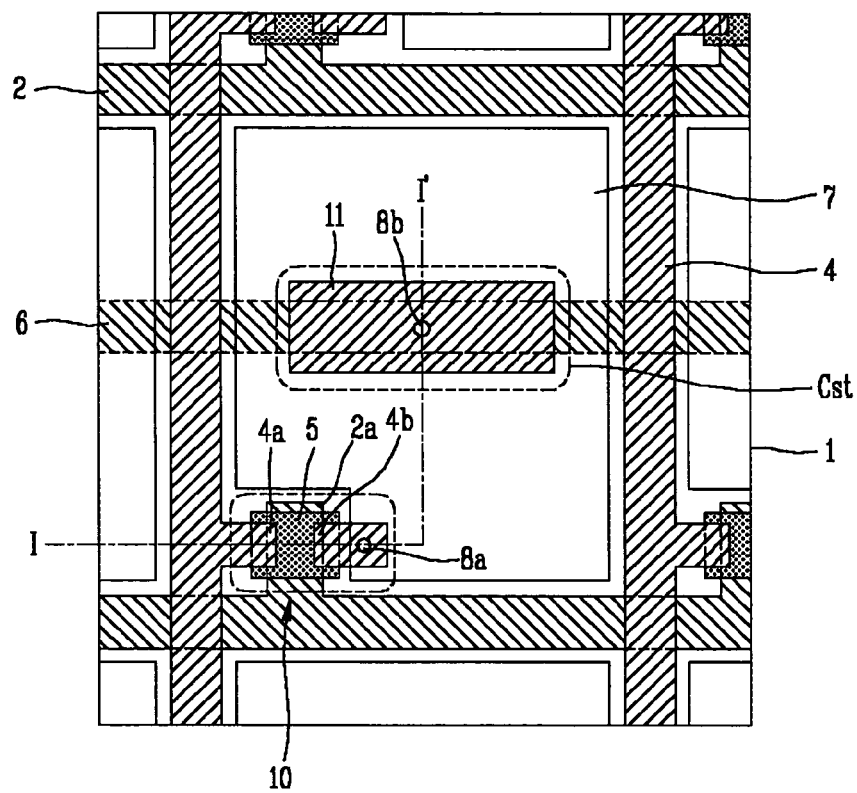
FIG. 1 is a plan view showing a structure of a conventional liquid crystal display device.
Figure 2:
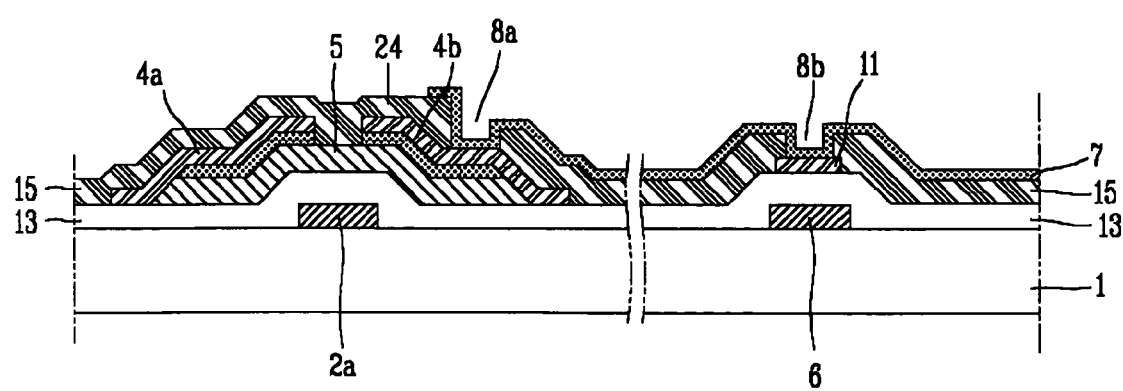
FIG. 2 is a cross-sectional view in the I-I line direction showing a thin film transistor and a storage capacitor of the liquid crystal display device shown in FIG. 1.
Figure 3A:
FIGS. 3A-3C are views illustrating a method for forming a pattern in a photo-mask process according to the conventional art.
Figure 3B:
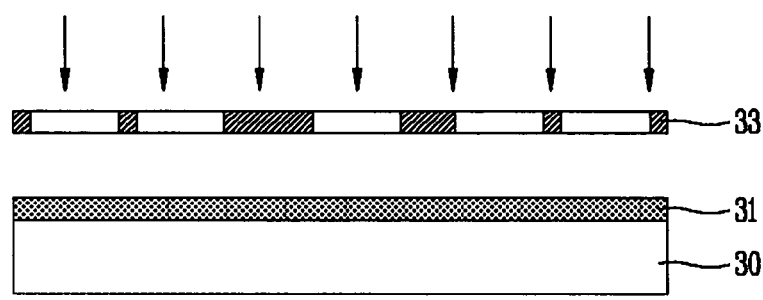
Figure 3C:
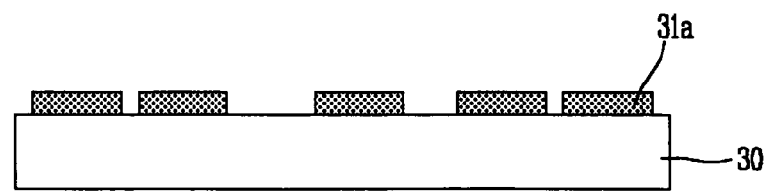
Figure 4A:
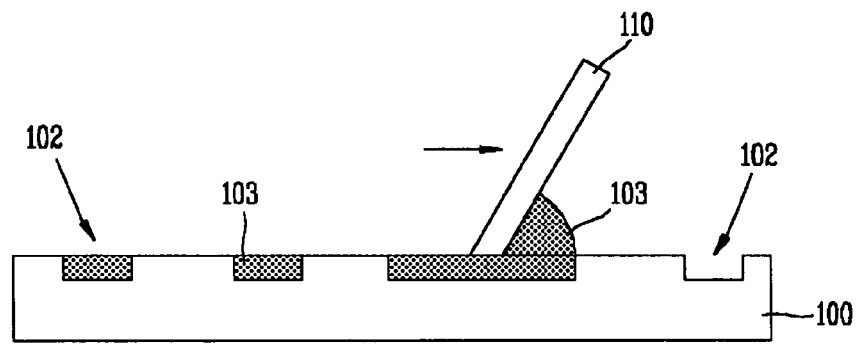
FIGS. 4A-4C are views illustrating a method for forming a pattern using a gravure offset printing method according to an embodiment of the invention.
Figure 4B:
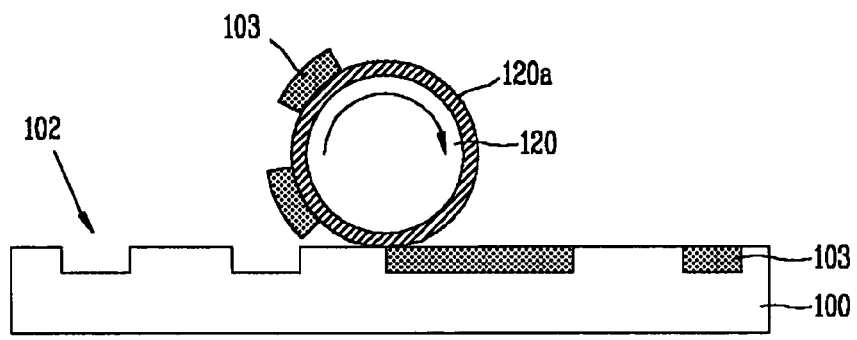
Figure 4C:
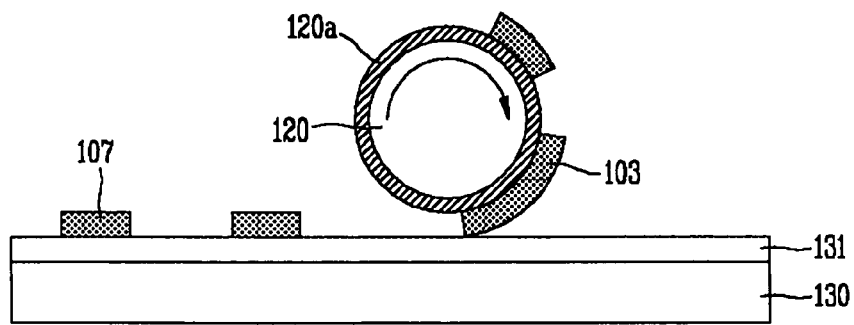

FIGS. 4A-4C are views illustrating the method for forming the pattern in a gravure offset printing method of a first embodiment of the invention. To begin with, as shown in FIG. 4A, a cliché 100 having concave groove 102 formed on a position corresponding to the pattern which will be formed on the substrate is provided. Then, a resist 103 is applied thereon. After that, a doctor blade 110 contacts the surface of the cliché 100, and then is pulled evenly to fill out the resist 103 in the groove 102 and to remove the resist remaining on the surface of the cliché 100.

As shown in FIG. 4B, the resist 103 filled in the groove 102 of the cliché 100 is transferred onto a surface of a printing roll 120 which contacts and rotates on the surface of the cliché 100. A blanket 120a is applied on the surface of the printing roll 120 for improving adhesive force with the resist 103 and to separate the resist 103 from the cliché 100 smoothly. In addition, the blanket 120a has the same width as that of the panel on the display device, and has a circumference similar to the length of the panel.

Therefore, the resist 103 filled in the groove 102 of the cliché 100 can be completely transferred onto the circumferential surface of the printing roll 120.

After that, as shown in FIG. 4C, the printing roll 120 rotates so that the resist 103 transferred on the printing roll 120 contacts to a surface of the etching object layer 131 formed on the substrate 130. The resist 103 is accordingly applied on the printing roll 120 and is transferred to the etching object layer 131. In addition, UV light or heat is radiated to the transferred resist 103 to dry the resist, and a resist pattern 107 thereby forms. At that time, the pattern 107 can be formed on the etching object layer 131 of the display device with one rotation of the printing roll 120.

As described above, the cliché 100 and the printing roll 120 can be fabricated according to the size of desired display device using the printing method, and the pattern can be formed on the substrate with one transfer operation. Therefore, a larger area pattern for the display device of larger area can be formed using one process.

The etching object layer 131 may be a metal layer for forming a metal pattern such as the gate electrode, the source/drain electrodes, the gate line, the data line of the thin film transistor or the pixel electrode and storage electrode, or the etching object layer 131 may be an insulating layer such as SiOx or SiNx.

After forming the above-described resist pattern 107 on the metal layer or on the insulating layer, the metal layer or the insulating layer is etched using a general etching process to form the metal layer of desired pattern (that is, electrode structure) or the insulating layer (for example, the contact hole, etc.).

According to the inventive printing process, the resist pattern can form on the substrate using one process. An especial advantage arises from the inventive process being simpler than those of the conventional art, and the processing time can thus be reduced.

However, the resist should be formed on the substrate with one process in the above printing method, and therefore, the sizes of the cliché, the printing roll 120 and the blanket 120a should be increased as the substrate becomes larger. Therefore, a large space is required to print the pattern on the substrate as the equipment becomes larger. Moreover, as the size of the printing roll 120 increases, the weight of the printing roll 120 also increases, and therefore care should be taken to ensure that a uniform pressure is impressed by the printing roll 120 on the entire substrate 130.

In addition, as the substrate distorts according to changes of processing temperature during processes such as depositing and etching processes, alignment between the substrate and the printing equipment is skewed since there is no apparatus which is able to compensate for the distortion. In more detail, the substrate generally used to fabricate the LCD device is a product of Corning, etc., and it distorts according to the temperature change. Especially, as the size of the substrate becomes larger, the magnitude of the change in the substrate increases as the temperature change increases. Table 1 shows maximum changed amount according to the temperature change for 1737 model and Eagle2000 model compared by sizes of substrates. As a reference, thermal expansion rate of the 1737 model is $37.8 \times 10^{-7}/°$ C., and the thermal expansion rate of the Eagle2000 model is $31.8 \times 10^{-7}/°$ C.

TABLE 1

| Temperature changed amount (° C.) | Size of substrate (mm) | Maximum deformation (μm) of substrate | |
|---|---|---|---|
| | | 1737 | Eagle2000 |
| 1 | 300 | 1.1 | 1.0 |
| | 600 | 2.3 | 1.9 |
| | 1,000 | 3.8 | 3.2 |
| | 1,500 | 5.7 | 4.8 |
| 5 | 300 | 5.7 | 4.8 |
| | 600 | 11.3 | 9.5 |
| | 1,000 | 18.9 | 15.9 |
| | 1,500 | 28.4 | 23.9 |
| 10 | 300 | 11.3 | 9.5 |
| | 600 | 22.7 | 19.1 |
| | 1,000 | 27.8 | 31.8 |
| | 1,500 | 56.7 | 47.7 |

At that time, the maximum deformation of the two models for temperature changes of 1° C., 5° C. and 10° C. were measured according to substrate size, that is, 300 mm, 600 mm, 1000 mm and 1500 mm. The units for the deformation amount are in μm.

The deformation according to the temperature change for the 1737 model in the case of 300 mm and 1500 mm substrate size will be discussed below.

First, when the temperature is changed about 1° C., the deformation of 300 mm and 1500 mm substrates are 1.1 μm and 5.7 μm, respectively. When the temperature changes about 5° C., the substrates are deformed about 5.7 μm and 28.4 μm. On the other hand, when the temperature change is 10° C., the 300 mm substrate is deformed about 11.3 μm and the 1500 mm substrate is deformed about 56.7 μm. As shown in the experimental results, as the size of the substrate increases, the deformation amount of the substrate for the temperature change increases in proportion to the increased size.

As described above, since there is no deformation of the cliché and the printing roll compensating for the deformation despite that the change in size of the substrate according to the temperature change, a misalignment results.

Therefore, an embodiment of the invention provides a method for forming a pattern which is able to adjust for the larger substrate and the temperature change to solve the above problems. That is, the substrate is divided into one or more unit panels, and the printing roll or the cliché is fabricated according to the divided regions. Therefore, the uniformity of the pattern for entire substrate can be ensured.

Figure 5:
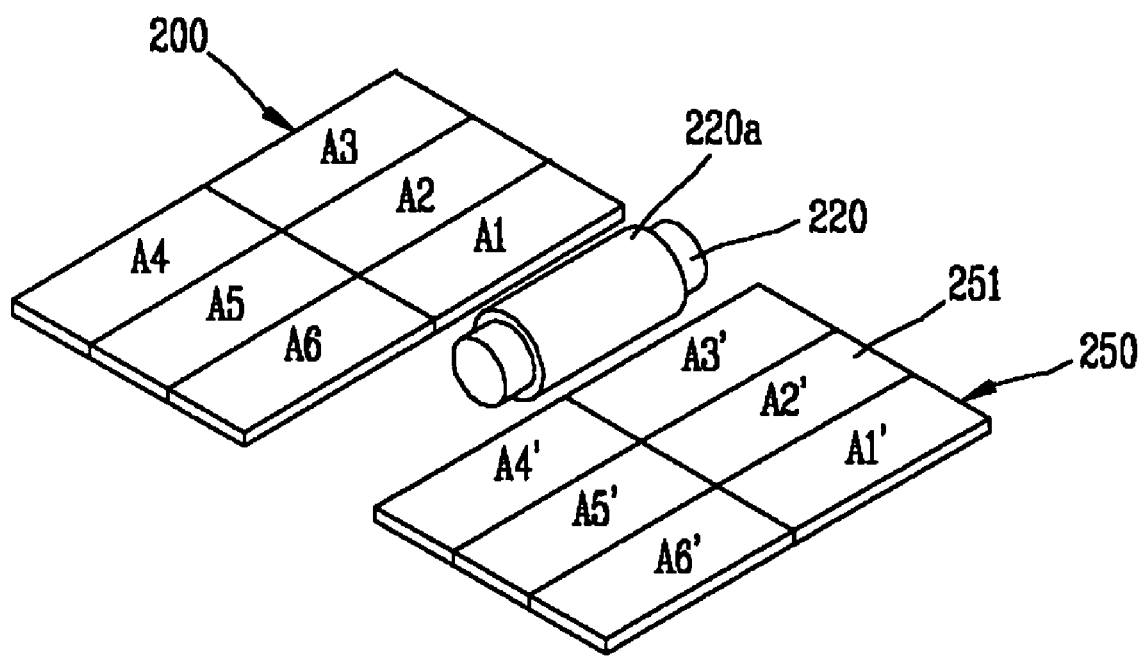
FIG. 5 is a view showing another embodiment of the invention.

FIG. 5 is a view showing a method for forming pattern suitable for the larger substrate. As shown therein, the cliché 200 is divided into 6 areas A1-A6, and the substrate (hereinafter, referred to as mother glass) 250 is divided into 6 areas A1'-A6' so as to correspond to the divided areas of the cliché 200. Then, a printing roll 220 suitable for the respective divided area is disposed. At that time, one unit panel 251 is included in one divided area, and the printing process is additionally proceeds for the respective unit panel 251.

First, the resist filled in area A1 transfers onto a surface of a blanket 220a of the printing roll 220, and then, applied onto the A1' area of the mother glass 250. At that time, the printing roll 220 prints the resist on the A1' area by one rotation. Therefore, the blanket 220a is formed to have same width as that of the unit panel 251 formed on the A1' area, and is formed to have a circumference of same length as that of the panel, but it is not mandatory. However, the blanket 220a should not be over the divided area of A1'. The patterns formed on the A2-A6 areas of the cliché are same as those formed on the A1 area, and therefore the patterns are formed on the remaining areas A2'-A6' by repeating the above process.

As described above, when the substrate is divided into multiple areas and printed, the area of the substrate on which the printing proceeds is actually reduced. Therefore, the deformation amount of the substrate according to the temperature change can be reduced. That is, as described above, as the size of substrate is reduced, the deformation amount according to the temperature change is reduced, and thereby the misalignment can be reduced during the printing process. Moreover, as the size of the printing roll is reduced, the fabrication cost is reduced, and a uniform pattern can be formed throughout the entire substrate.

Figure 6A:
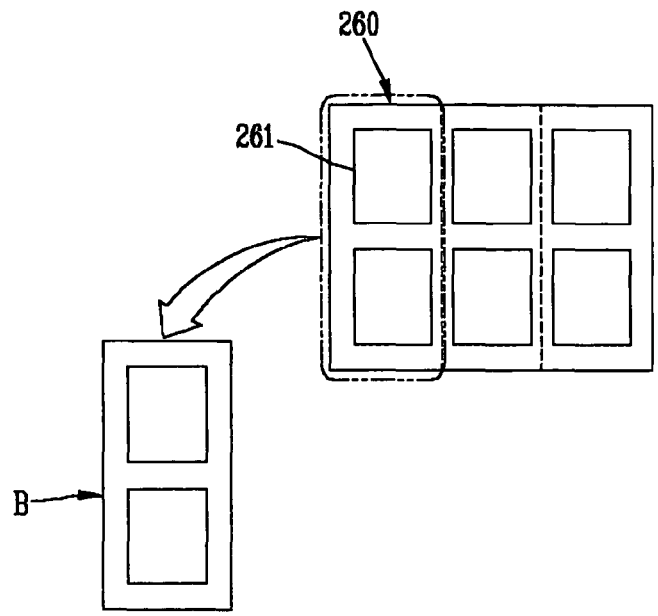
FIGS. 6A and 6B are views showing still another embodiment of the invention.
Figure 6B:
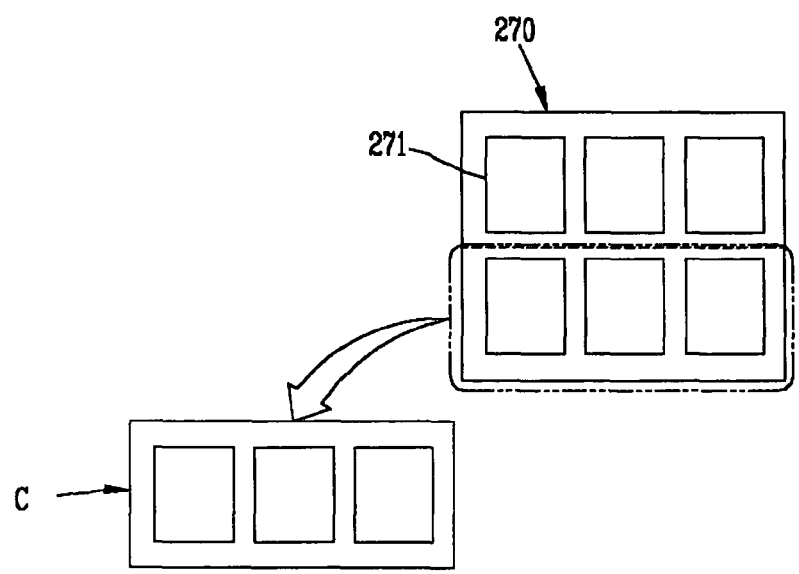

On the other hand, the cliché and the substrate can be divided so as to includes at least two or more unit panels. That is, as shown in FIGS. 6A and 6B, the mother glass 260 is divided in a width direction, and the two unit panels 261 on the upper and lower sides are made as one unit, and the printing process is proceeded thereon. Then, the pattern can be formed on entire mother glass 260 by rotating the printing roll for three times. At that time, the entire area of the blanket should be same as the divided area B including the two unit panels. Also, as shown in FIG. 6B, when the mother glass 270 is divided in a length-wise direction, the three unit panels 271 disposed from the left to the right are made as one unit and the printing process is performed, the pattern can then be performed on entire mother glass by rotating the printing roll for twice. At that time, the entire area of the blanket should be same as the divided area C including the three unit panels.

In addition, the cliché can be simplified in order to reduce the space occupied by the printing apparatus. That is, the cliché is fabricated to have the same size as that of the divided area on the substrate, and therefore the material cost can be reduced and the efficiency of the space utility can be improved.

As described above, according to the invention, the resist pattern is formed by one printing process, and therefore the processing equipment can be simplified as compared to that of the related photo-mask process. The processing time and cost can thus be reduced to improve the productivity. Also, according to the invention, the printing area is divided to prevent the printing apparatus from becoming larger as the substrate becomes larger to thereby reduce the material cost, and the misalignment can be reduced as the printing area is reduced. Therefore, the uniformity of the pattern formed on entire substrate can be improved.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method for forming a pattern, comprising:
   providing a substrate on which a plurality of unit panels and etching object layers on the respective unit panel areas are formed, each of the unit panels including a plurality of gate lines and data lines defining a plurality of pixels, a thin film transistor in each pixel, and a pixel electrode in each pixel;

providing a cliché on which a plurality of grooves are formed, the cliché being divided into a plurality of portions corresponding in number and size to the plurality of unit panels of the substrate;

filling resist in the grooves;

transferring the resist in the grooves of at least one divided portion of the plurality of divided portions of the cliché but less than the total number of the plurality of the divided portions of the cliché onto substantially the whole area of a blanket applied on a surface of a printing roll by contacting and rotating the printing roll with respect to said at least one divided portion but less than the total number of the plurality of the divided portions of the cliché, the whole area of the blanket applied on the surface of the printing roll corresponding in size to (1) the area of said at least one divided portion of the plurality of divided portions of, but less than the total number of, the plurality of divided portions of the unit panels and (2) the area of at least one divided portion of the plurality of divided portions of, but less than the total number of, the plurality of divided portions of the cliché;

applying the resist transferred on the whole area of the surface of the blanket of the printing roll on to the etching object layer on said at least one divided portion of the plurality of divided portions of, but less than the total number of, the plurality of divided portions of the unit panels of the substrate; and repeating the transferring process and applying process to the etching object layer on at least one other unit panel of the substrate from at least one other divided portion of the cliché using the printing rolling.

2. The method of claim 1, wherein the printing roll has a same width as that of the corresponding unit panel of the substrate.

3. The method of claim 2, wherein a length of the blanket of the printing roll is the same as a length of a circumference of the printing roll, which is same as a length of the unit panel of the substrate.

4. The method of claim 1, wherein the printing roll is formed to have a same size as that of the unit panel of the substrate.

5. The method of claim 1, wherein the etching object layer includes a metal layer.

6. The method of claim 1, wherein the etching object layer includes an insulating layer comprised of SiOx or SiNx.

7. The method of claim 1, wherein the etching object layer is a semiconductor layer.

8. The method of claim 1, wherein the blanket improves adhesive force with the resist.

9. The method of claim 1, wherein a total number of the plurality of unit panels is at least six, and the number of unit panels to which resist is transferred is three or fewer.

* * * * *